US012804987B2

(12) United States Patent
Huang

(10) Patent No.: US 12,804,987 B2
(45) Date of Patent: Nov. 17, 2026

(54) SEMICONDUCTOR STRUCTURE AND METHOD OF MANUFACTURING THE SAME

(71) Applicant: NANYA TECHNOLOGY CORPORATION, New Taipei City (TW)

(72) Inventor: Tse-Yao Huang, Taipei City (TW)

(73) Assignee: NANYA TECHNOLOGY CORPORATION, New Taipei City (TW)

( * ) Notice: Subject to any disclaimer, the term of this patent is extended or adjusted under 35 U.S.C. 154(b) by 413 days.

(21) Appl. No.: 18/430,890

(22) Filed: Feb. 2, 2024

(65) Prior Publication Data

US 2025/0254962 A1 Aug. 7, 2025

(51) Int. Cl.
*H10D 64/27* (2025.01)
*H10D 62/17* (2025.01)
*H10W 10/00* (2026.01)
*H10W 10/17* (2026.01)

(52) U.S. Cl.
CPC ......... *H10D 64/512* (2025.01); *H10D 62/235* (2025.01); *H10W 10/014* (2026.01); *H10W 10/17* (2026.01)

(58) Field of Classification Search
CPC .. H10D 64/512; H10D 62/235; H10D 30/027; H10D 64/027; H10D 64/513; H10D 62/115; H10D 30/60; H10D 62/292; H10D 64/685; H10W 10/014; H10W 10/17; H10B 12/053; H10B 12/09
See application file for complete search history.

(56) References Cited

U.S. PATENT DOCUMENTS 6,825,526 B1 11/2004 He et al.
2011/0284939 A1* 11/2011 Chung ................ H10B 12/053 257/296

(Continued)

FOREIGN PATENT DOCUMENTS

TW 201426881 A 7/2014
TW 202040652 A 11/2020

(Continued)

OTHER PUBLICATIONS

Summary translation of Office Action and and the search report mailed on Apr. 8, 2025 related to Taiwanese. Application No. 113112309 and Summary translation of Office Action and and the search report mailed on May 28, 2025 related to Taiwanese Application No. 113145558.

*Primary Examiner* — Yasser A Abdelaziez
(74) *Attorney, Agent, or Firm* — Xuan Zhang

(57) ABSTRACT

The present application discloses a semiconductor device including a substrate, a first buried gate structure, and a second buried gate structure. The substrate has an array region and a periphery region. The first buried gate structure is extended from a first surface of the substrate along a first direction into the substrate and disposed in the array region. The second buried gate structure is extended from the first surface of the substrate along the first direction into the substrate and disposed in the periphery region. A depth of the first buried gate structure is less than a depth of the second buried gate structure along the first direction.

9 Claims, 18 Drawing Sheets

(56) References Cited

U.S. PATENT DOCUMENTS

| | | | | |
|---|---|---|---|---|
| 2015/0214230 | A1* | 7/2015 | Kim | H10B 12/053 257/773 |
| 2015/0295071 | A1 | 10/2015 | Hikasa | |
| 2021/0126124 | A1 | 4/2021 | Hsieh | |
| 2021/0265475 | A1* | 8/2021 | Yang | H10D 62/115 |
| 2022/0320288 | A1 | 10/2022 | Agata et al. | |

FOREIGN PATENT DOCUMENTS

| | | | |
|---|---|---|---|
| TW | 202133441 | A | 9/2021 |
| TW | 202240848 | A | 10/2022 |

* cited by examiner

70

SEMICONDUCTOR STRUCTURE AND METHOD OF MANUFACTURING THE SAME

TECHNICAL FIELD

The present disclosure relates to a semiconductor structure and a method of manufacturing the same, and more particularly, to a semiconductor structure with wider channels and a method of manufacturing the same.

DISCUSSION OF THE BACKGROUND

According the functionalities and requirements of electrical components, a semiconductor structure may be divided to a dense area and a loose area. Therefore, there is not necessary to manufacture electrical components, which have the same dimension, in both area. In other words, the manufacturing process performed to the dense area and the loose area is not necessary to be the same This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor device including a substrate, a first buried gate structure, and a second buried gate structure. The substrate has an array region and a periphery region. The first buried gate structure is extended from a first surface of the substrate along a first direction into the substrate and disposed in the array region. The second buried gate structure is extended from the first surface of the substrate along the first direction into the substrate and disposed in the periphery region. A depth of the first buried gate structure is less than a depth of the second buried gate structure along the first direction.

Another aspect of the present disclosure provides a method of manufacturing a semiconductor structure. The method includes: providing a substrate having an array region and a periphery region; forming a first opening and a second opening in the array region and the periphery region, respectively; forming a third opening through the second opening; and forming a first buried gate structure and a second buried gate structure. The first buried gate structure is formed in the first opening, and the second buried gate structure is formed in the second opening and the third opening.

The foregoing has outlined rather broadly the features and technical advantages of the present disclosure in order that the detailed description of the disclosure that follows may be better understood. Additional features and advantages of the disclosure will be described hereinafter and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
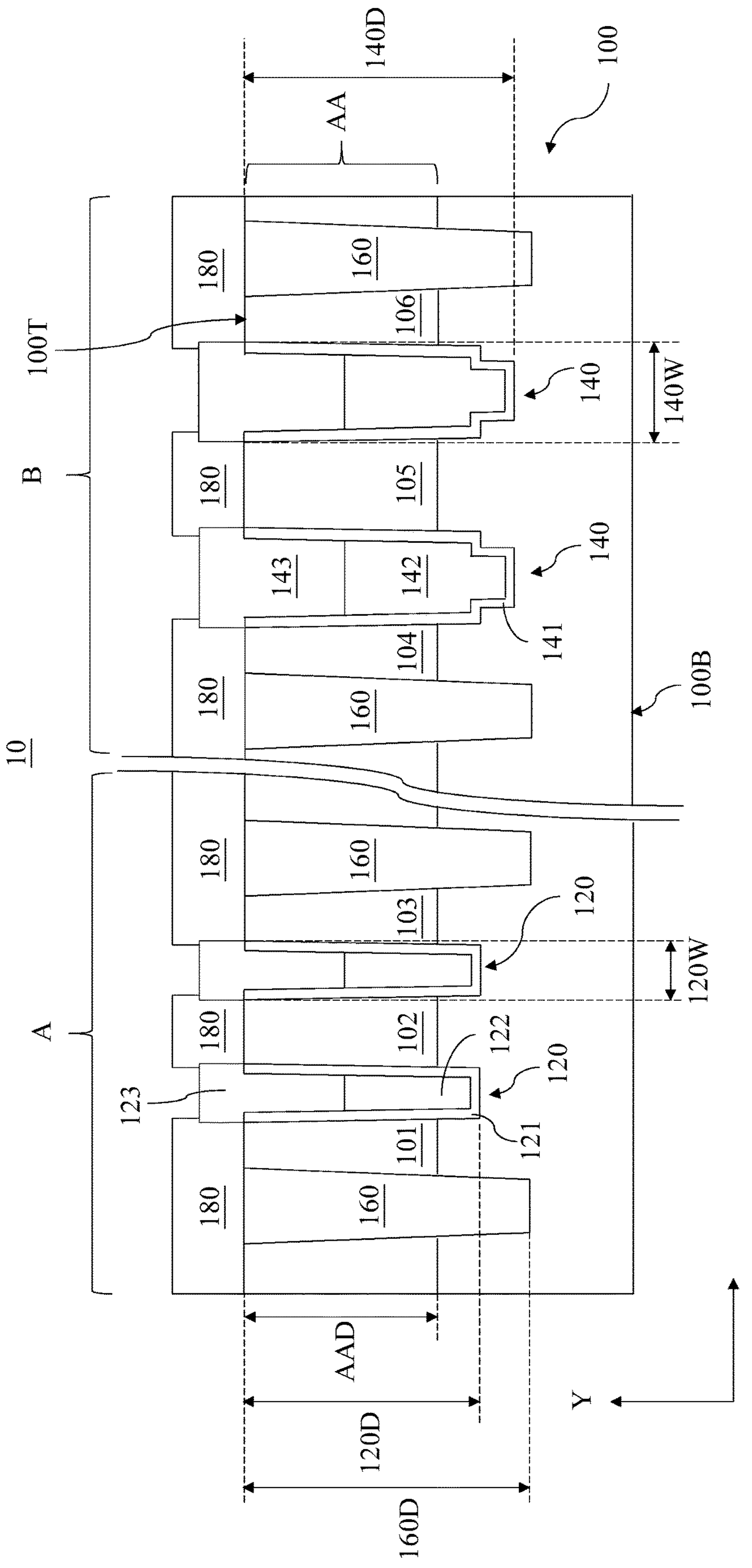
FIG. 1 is schematic diagram of a semiconductor structure according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a schematic diagram of a semiconductor structure 10 according to some embodiments of the present disclosure. In some embodiments, the semiconductor structure 10 may include a memory structure, such as a dynamic random-access memory (DRAM).

The semiconductor structure 10 has an array region A and a periphery region B. In some embodiments, the memory cell may be implemented in the array region A, and the controller circuit may be implemented in the periphery region B. In some embodiments, the array region A is also known as a dense region which has higher density of components, and the periphery region B is also known as a loose region which has lower density of components.

The semiconductor structure 10 includes a substrate 100, a plurality of first buried gate structures 120, a plurality of second buried gate structure 140, a plurality of isolation structures 160, and a plurality of metal lines 180.

In some embodiments, each of the first buried gate structures 120 are identical to each other, and each of the second buried gate structures 140 are identical to each other. Therefore, the following description will only elaborate one of the first buried gate structures 120 and one of the second buried gate structures 140 for the sake of brevity.

In some embodiments, the substrate 100 is a semiconductor wafer, such as a silicon wafer. In some embodiments, the substrate 100 may include elementary semiconductor materials, compound semiconductor materials, and/or alloy semiconductor materials. Examples of the elementary semiconductor materials may include, but are not limited to, crystal silicon, polycrystalline silicon, amorphous silicon, germanium, and/or diamond. Examples of the compound semiconductor materials may include, but are not limited to, silicon carbide, gallium arsenic, gallium phosphide, indium phosphide, indium arsenide, and/or indium antimonide. Examples of the alloy semiconductor materials may include, but are not limited to, SiGe, GaAsP, AlInAs, AlGaAs, GaInAs, GaInP, and/or GaInAsP.

In some embodiments, the substrate 100 includes an epitaxial layer. For example, the substrate 100 has an epitaxial layer overlying a bulk semiconductor. In some embodiments, the substrate 100 is a semiconductor-on-insulator substrate which may include a substrate, a buried oxide layer over the substrate, and a semiconductor layer over the buried oxide layer, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods.

The substrate 100 has a top surface 100T and a bottom surface 100B opposite to the top surface 100T. The substrate 100 includes an active area AA. The active area AA is implemented on the upper portion of the substrate 100, in which the active area AA is coplanar with the top surface 100T of the substrate 100.

The first buried gate structures 120, the second buried gate structures 140, and the isolation structures 160 are disposed in the substrate 100 and extended from the top surface 100T along a Y direction toward the bottom surface 100B. The first buried gate structures 120 are disposed in the array region A, and the second buried gate structures 140 are disposed in the periphery region B. The isolation structures 160 are disposed in both array region A and the periphery region B.

As illustrated in FIG. 1, the first buried gate structures 120, the second buried gate structures 140, and the isolation structures 160 are protruding from a bottom surface of the active area AA. In other words, each of a depth 120D of the first buried gate structure 120, a depth 140D of the second buried gate structure 140, and a depth 160D of the isolation structure 160 is greater than a depth AAD of the active area AA.

The active area AA includes a doped region 101, a doped region 102, a doped region 103, a doped region 104, a doped region 105, and a doped region 106. The doped regions 101, 102, and 103 are disposed in the array region A and sequentially along an X direction, and the doped regions 104, 105, and 106 are disposed in the periphery region B and sequentially along the X direction. In some embodiments, the X direction is perpendicular to the Y direction. The first buried gate structures 120 are interleaved with the doped regions 101, 102, and 103, and the second buried gate structures 140 are interleaved with the doped regions 104, 105, and 106.

As illustrated in FIG. 1, at least two isolation structures 160 disposed in the array region A, and at least two isolation structures 160 disposed in the periphery region B. The first buried gate structures 120, the doped region 101, the doped region 102, and the doped region 103 are disposed between the two isolation structures 160 in the array region A. The second buried gate structures 140, the doped region 104, the doped region 105, and the doped region 106 are disposed between the two isolation structures 160 in the periphery region B.

In some embodiments, the isolation structures 160 are shallow-trench isolation (STI). The isolation structures 160 may include at least one of a silicon nitride, a silicon oxide, or a silicon oxynitride.

The metal lines 180 are disposed over the substrate 100 and in contact with the doped regions 101, 102, 103, 104, 105, and 106, respectively. The metal lines 180 are electrically coupled to the doped regions 101, 102, 103, 104, 105, and 106. In some embodiments, the metal lines 180 includes metal, such as tungsten (W), copper (Cu), ruthenium (Ru), iridium (Ir), nickel (Ni), osmium (Os), rhodium (Rh), aluminum (Al), molybdenum (Mo), cobalt (Co), alloys thereof, combinations thereof or any metallic material with suitable resistance.

The first buried gate structure 120 includes a gate dielectric layer d and a gate electrode 122, and the second buried gate structure 140 includes a gate dielectric layer 141 and a gate electrode 142. The gate dielectric layer 121 is extended along a contour of the first buried gate structure 120, and the gate electrode 122 is surrounded by the gate dielectric layer 121. The gate electrode 122 is separated and isolated from the substrate 100 by the gate dielectric layer 121. The gate dielectric layer 141 is extended along a contour of the second buried gate structure 140, and the gate electrode 142 is surrounded by the gate dielectric layer 141. The gate electrode 142 is separated and isolated from the substrate 100 by the gate dielectric layer 141.

In some embodiments, the gate dielectric layer 121 and the gate dielectric layer 141 include a dielectric material, such as such as silicon oxide, silicon nitride, silicon carbide, silicon oxynitride, a high-k dielectric material, or other suitable dielectric materials. The high-k dielectric material may include $HfO_2$, HfErO, HfLaO, HfYO, HfGdO, HfAlO, HfZrO, HfTiO, HfTaO, $ZrO_2$, $Y_2O_3$, $La_2O_5$, $Gd_2O_5$, $TiO_2$, $Ta_2O_5$, SrTiO, or combinations thereof.

In some embodiments, the gate electrode 122 and the gate electrode 142 may include several layers, such as a lower electrode layer and an upper electrode layer. In such embodiment, the lower electrode layer may include a work function material such as titanium, titanium nitride, silicon, silicon germanium, or a combination thereof; and the upper electrode layer may include polycrystalline silicon, polycrystalline germanium, polycrystalline silicon germanium, doped polycrystalline silicon, doped polycrystalline germanium, doped polycrystalline silicon germanium, or a combination thereof. In some embodiments, the upper electrode layer may be doped with p-type dopants or n-type dopants. It should be noted that the term "work function" refers to the bulk chemical potential of a material (e.g., metal) relative to the vacuum level.

In some embodiments, semiconductor structure 10 includes transistors. The first buried gate structures 120 and the second buried gate structure 140 are configured to be gates of the transistors, and the doped region 101 to doped region 106 are configured to be sources/drains of the transistors. In such embodiment, the gate electrode 122 and/or the gate electrode 142 are configured to be a word line of the memory, and the metal lines 180 are configured to be the bit line of the memory.

The first buried gate structure 120 further includes a capping layer 123, and the second buried gate structure 140 further includes a capping layer 143. The capping layer 123 is disposed over the gate electrode 122 and separated from the substrate 100 by the gate dielectric layer 121, and the capping layer 143 is disposed over the gate electrode 142 and separated from the substrate 100 by the gate dielectric layer 141.

As illustrated in FIG. 1, the capping layer 123 is extended over the gate dielectric layer 121, and the capping layer 143 is extended over the gate dielectric layer 141. In some embodiments, sidewalls of the capping layer 123 is aligned with sidewalls of the gate dielectric layer 121, and sidewalls of the capping layer 143 is aligned with sidewalls of the gate dielectric layer 141. The capping layer 123 and the capping layer 143 are in contact with the metal lines 180. The metal lines 180 are extended over the capping layer 123 and the capping layer 143.

In some embodiments, the capping layer 123 and the capping layer 143 include a dielectric material. In some embodiments, the capping layer 123 and the capping layer 143 include silicon nitride, silicon oxide, or silicon oxynitride.

As mentioned above, the density of electrical components in the array region A is greater than the density of electrical components in the periphery region B. Consequently, the electrical components in the periphery region B may have greater space to implement and/or wider pitch between each other. As such, there is greater space for implementing the second buried gate structure 140 than implementing the first buried gate structure 120. As illustrated in FIG. 1, a width 140W of the second buried gate structure 140 is greater than a width 120W of the first buried gate structure 120. In some embodiments, the sidewalls of the first buried gate structure 120 and the second buried gate structure 140 are not aligned with the Y direction. It should be noted that the width 120W and the width 140W are measured at the widest portion of the first buried gate structure 120 and the widest portion of the second buried gate structure 140 along the X direction, respectively.

Figure 2B:
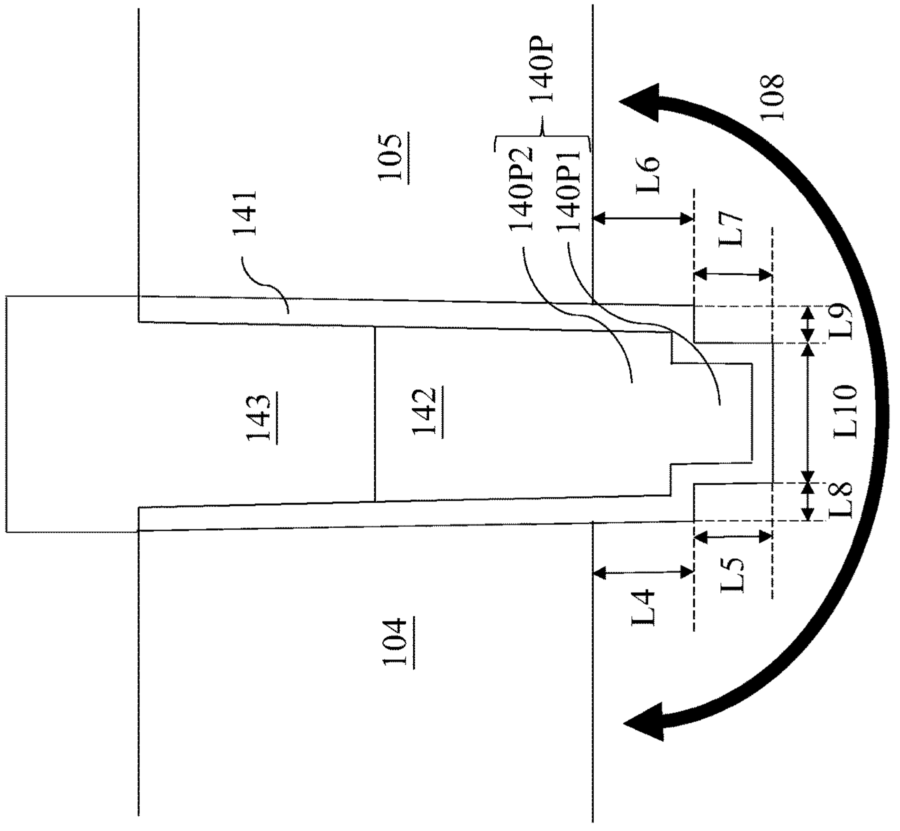
FIG. 2B is a schematic diagram of the second buried gate structure of the semiconductor structure according to some embodiments of the present disclosure.
Figure 2A:
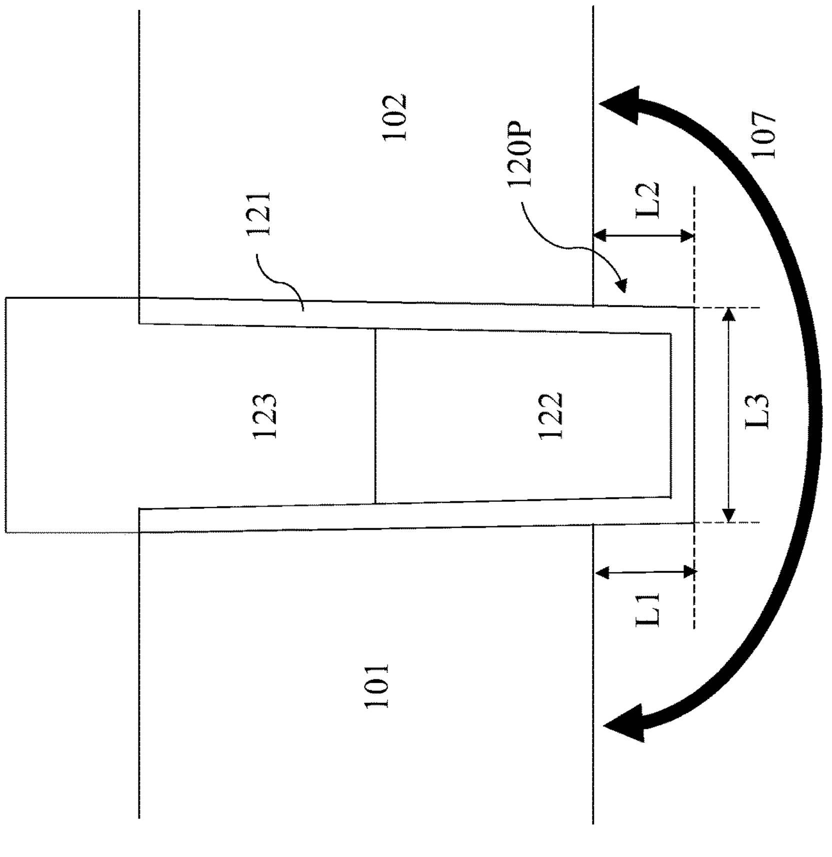
FIG. 2A is a schematic diagram of the first buried gate structure of the semiconductor structure according to some embodiments of the present disclosure.

Reference is made to FIG. 2A and FIG. 2B. FIG. 2A is a schematic diagram of the first buried gate structure 120 according to some embodiments of the present disclosure. FIG. 2B is a schematic diagram of the second buried gate structure 140 according to some embodiments of the present disclosure.

The first buried gate structure 120 has a protruding portion 120P protruding from the active area AA toward the bottom surface 100B of the substrate 100. The second buried gate structure 140 has a protruding portion 140P protruding from the active area AA toward the bottom surface 100B of the substrate 100.

The substrate 100 further includes a channel region 107 and a channel region 108 disposed in the array region A and the periphery region B, respectively. The channel region 107 connects the doped region 101 to the doped region 102 along sidewalls of the protruding portion 120P. The channel region 108 connects the doped region 104 to the doped region 105 along sidewalls of the protruding portion 140P. That is to say, the protruding portion 120P is surrounded by the channel region 107, and the protruding portion 140P is surrounded by the channel region 108. For the sake of clarity, the channel region 107 and the channel region 108 are illustrated using bolded double arrow curves.

The protruding portion 120P has a side length equal to the sum of a left length L1, a right length L2, and a bottom length L3 of the protruding portion 120P. Because the protruding portion 120P is surrounded by the channel region 107, the side length of the protruding portion 120P can be view as the channel length of the channel region 107.

The protruding portion 140P has a side length equal to the sum of a first left length L4, a second left length L5, a first right length L6, a second right length L7, a first bottom length L8, a second bottom length L9, and a third bottom length L10 of the protruding portion 140P. Because the protruding portion 140P is surrounded by the channel region 108, the side length of the protruding portion 140P can be view as the channel length of the channel region 108.

In some embodiments, the depth 120D of the first buried gate structure 120 is less than the depth 140D of the second buried gate structure 140. Furthermore, as mentioned above, the width 120W of the first buried gate structure 120 is less than the width 140W of the second buried gate structure 140. Therefore, the protruding portion 140P has a greater dimension than the protruding portion 120P, and the side length of the protruding portion 140P is greater than the side length of the protruding portion 120P. As a result, the channel length of the channel region 108 is longer than the channel length of the channel region 107.

Compared to the protruding portion 120P, the protruding portion 140P includes a lower part 140P1 and an upper part 140P2 over the lower part 140P1. The lower part 140P1 is narrower than the upper part 140P2 along the X direction. The lower part 140P1 and the upper part 140P2 forms the protruding portion 140P having a stair-step sidewall.

The stair-step sidewall includes: a first left side, a first right side, a first bottom side, and a second bottom side corresponding to the upper part 140P2; and a second right side, a second left side, and a third bottom side corresponding to the lower part 140P1. The first left side has the first right length L4. The first right side has the first right length L6. The first bottom side has the first bottom length L8. The second bottom side has the second bottom length L9. The second left side has the second right length L5. The second right side has the second right length L7. The third bottom side has the third bottom length L10.

In some embodiments, the left length L1 is equal to the first left length L4, and the right length L2 is equal to the first right length L6. The bottom length L3 is less than the sum of the first bottom length L8, the second bottom length L9, and the third bottom length L10.

Because the channel length of the channel region 108 is greater than the channel length of the channel region 107, the channel region 108 has a lower effective resistance than the channel region 107. Thus, the channel region 108 can conduct higher current than the channel region 107. Generally speaking, a higher current can achieve higher performance for an electrical component. When the channel region 108 conducts higher current, the electrical components in the periphery region B cab have higher performance.

Figure 3:
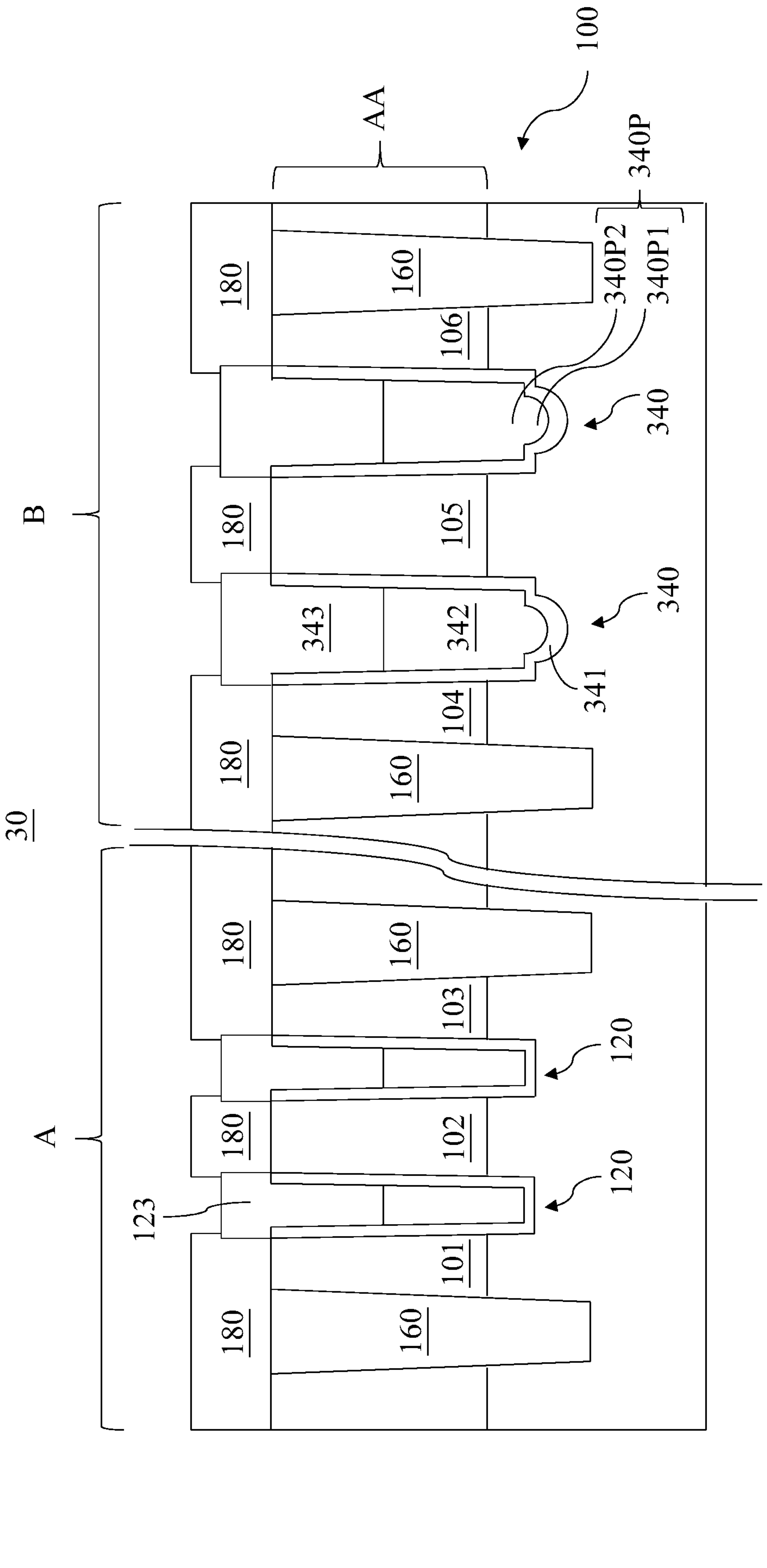
FIG. 3 is a schematic diagram of a semiconductor structure according to other embodiments of the present disclosure.
Figure 4:
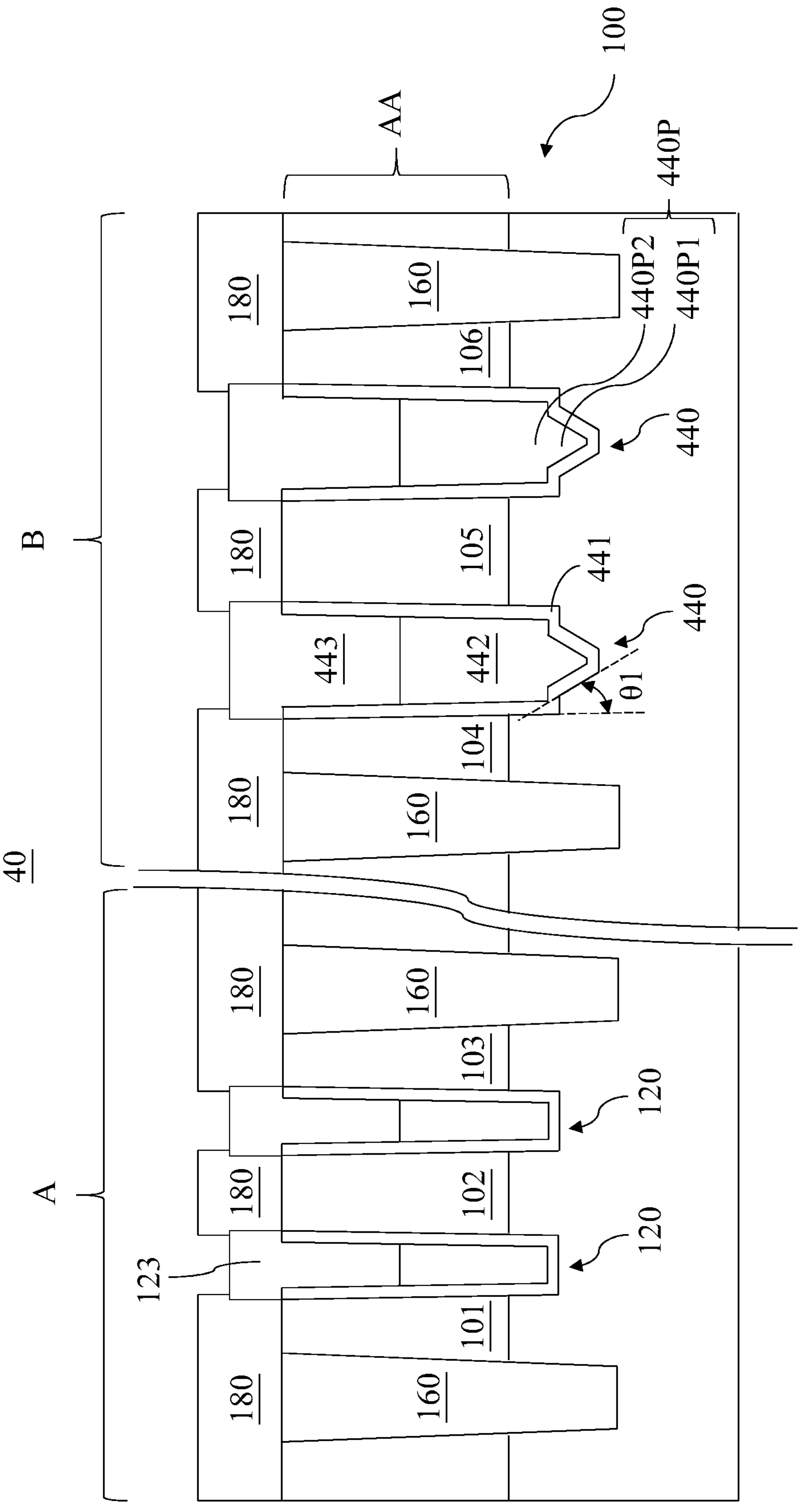
FIG. 4 is a schematic diagram of a semiconductor structure according to various embodiments of the present disclosure.
Figure 5:
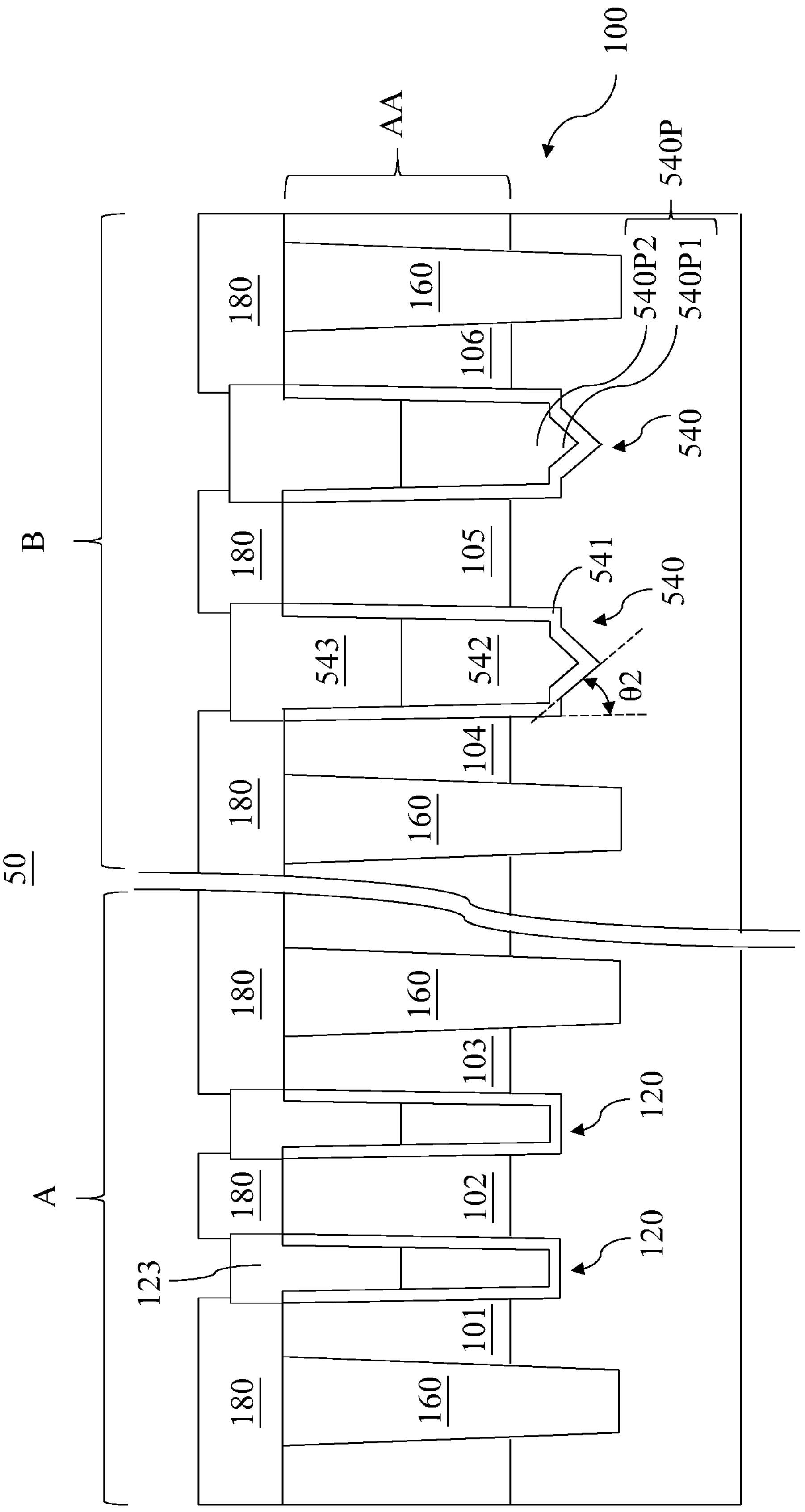
FIG. 5 is a schematic diagram of a semiconductor structure according to alternative embodiments of the present disclosure.
Figure 6:
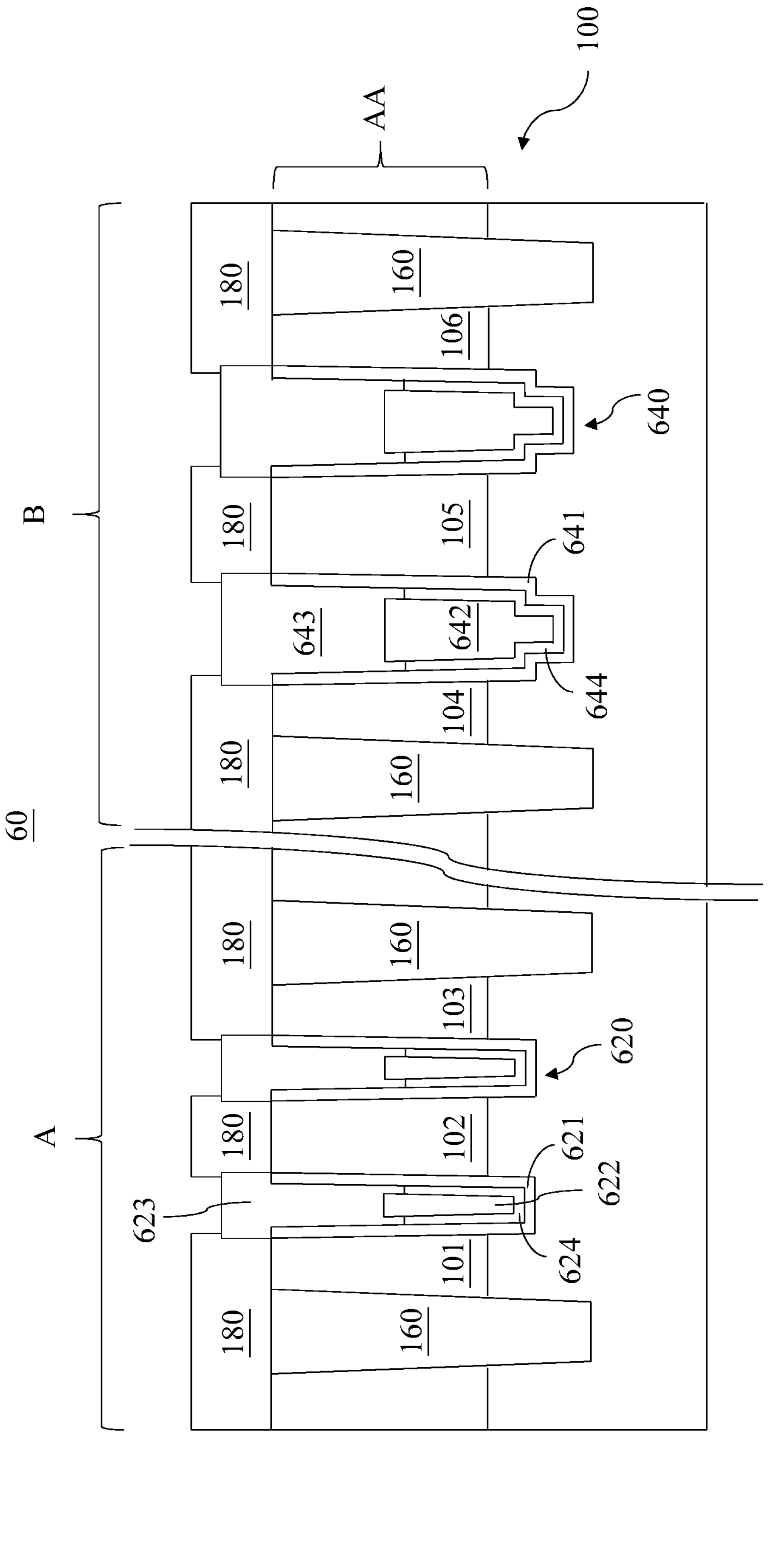
FIG. 6 is a schematic diagram of a semiconductor structure according to further embodiments of the present disclosure.

The semiconductor structure 10 shown in FIG. 1, FIG. 2A, and FIG. 2B are provided for illustrated purposes, however, the present disclosure is not limited thereto. In various embodiments, the buried gate structure may have different structures as shown in FIG. 3. FIG. 4, FIG. 5, and FIG. 6.

FIG. 3 is a schematic diagram of a semiconductor structure 30 according to other embodiments of the present disclosure. FIG. 4 is a schematic diagram of a semiconductor structure 40 according to various embodiments of the present disclosure. FIG. 5 is a schematic diagram of a semiconductor structure 50 according to alternative embodiments of the present disclosure. FIG. 6 is a schematic diagram of a semiconductor structure 60 according to further embodiments of the present disclosure.

The semiconductor structure 30, the semiconductor structure 40, the semiconductor structure 50, and the semiconductor structure 60 are similar to the semiconductor structure 10. Therefore, the reference numerals of similar components shown in FIG. 3 to FIG. 6 are designated with the same reference numerals shown in FIG. 1, FIG. 2A, and FIG. 2B, and the descriptions of the similar components are omitted.

In FIG. 3, compared to the semiconductor structure 10, the semiconductor structure 30 has a second buried gate structure 340 different from the second buried gate structure 140 of the semiconductor structure 10.

The second buried gate structure 340 includes a gate dielectric layer 341, a gate electrode 342, and a capping layer 343. The capping layer 343 is disposed over the gate electrode 342. The gate electrode 342 and the capping layer 343 are surrounded by the gate dielectric layer 341. The gate electrode 342 and the capping layer 343 are separated from the substrate 100 by the gate dielectric layer 341.

The second buried gate structure 340 has a protruding portion 340P. The protruding portion 340P includes a lower part 340P1 and an upper part 340P2 over the lower part 340P1. As illustrated in FIG. 3, the lower part 340P1 has a curved sidewall.

In FIG. 4, compared to the semiconductor structure 10, the semiconductor structure 40 has a second buried gate structure 440 different from the second buried gate structure 140 of the semiconductor structure 10.

The second buried gate structure 440 includes a gate dielectric layer 441, a gate electrode 442, and a capping layer 443. The capping layer 443 is disposed over the gate electrode 442. The gate electrode 442 and the capping layer 443 are surrounded by the gate dielectric layer 441. The gate electrode 442 and the capping layer 443 are separated from the substrate 100 by the gate dielectric layer 441.

The second buried gate structure 440 has a protruding portion 440P. The protruding portion 440P includes a lower part 440P1 and an upper part 440P2 over the lower part 440P1.

As illustrated in FIG. 4, an included angle θ1 between a sidewall of the upper part 440P2 and a sidewall of the lower part 440P1 is greater than 0, and the lower part 440P1 has a bottom sidewall substantially parallel to the X direction.

In FIG. 5, compared to the semiconductor structure 10, the semiconductor structure 50 has a second buried gate structure 540 different from the second buried gate structure 140 of the semiconductor structure 10.

The second buried gate structure 540 includes a gate dielectric layer 541, a gate electrode 542, and a capping layer 543. The capping layer 543 is disposed over the gate electrode 542. The gate electrode 542 and the capping layer 543 are surrounded by the gate dielectric layer 541. The gate electrode 542 and the capping layer 543 are separated from the substrate 100 by the gate dielectric layer 541.

The second buried gate structure 540 has a protruding portion 540P. The protruding portion 540P includes a lower part 540P1 and an upper part 540P2 over the lower part 540P1.

As illustrated in FIG. 5, an included angle θ2 between a sidewall of the upper part 540P2 and a sidewall of the lower part 540P1 is greater than 0. In some embodiments, the included angle θ2 is greater than the included angle θ1 as shown in FIG. 4. Compared to the lower part 440P1 shown in FIG. 4, the lower part 540P1 do not have a flat bottom side.

In FIG. 6, compared to the semiconductor structure 10, the semiconductor structure 60 has a first buried gate structure 620 and a second buried gate structure 640 different from the first buried gate structure 120 and the second buried gate structure 140 of the semiconductor structure 10.

The first buried gate structure 620 includes gate dielectric layer 621, a gate electrode 622, a capping layer 623, and a barrier layer 624. The capping layer 623 is disposed over the gate electrode 622. The gate electrode 622 and the capping layer 623 are surrounded by the gate dielectric layer 621. The gate electrode 622 and the capping layer 623 are separated from the substrate 100 by the gate dielectric layer 621. The barrier layer 624 is disposed between the gate dielectric layer 621 and the gate electrode 622, and is in contact with the capping layer 623. The gate electrode 622 is separated from the gate dielectric layer 621 by the barrier layer 624.

The second buried gate structure 640 includes gate dielectric layer 641, a gate electrode 642, a capping layer 643, and a barrier layer 644. The capping layer 643 is disposed over the gate electrode 642. The gate electrode 642 and the capping layer 643 are surrounded by the gate dielectric layer 641. The gate electrode 642 and the capping layer 643 are separated from the substrate 100 by the gate dielectric layer 641. The barrier layer 644 is disposed between the gate dielectric layer 641 and the gate electrode 642, and is in contact with the capping layer 643. The gate electrode 642 is separated from the gate dielectric layer 641 by the barrier layer 644.

In some embodiments, the barrier layer 624 and the barrier layer 644 are configured to prevent materials of the gate electrode 622 and the gate electrode 642 from diffusing into the substrate 100 through the gate dielectric layer 621 and the gate dielectric layer 641, respectively. In some embodiments, the barrier layer 624 and the barrier layer 644 includes titanium nitride, tantalum nitride, or other suitable material.

Figure 7:
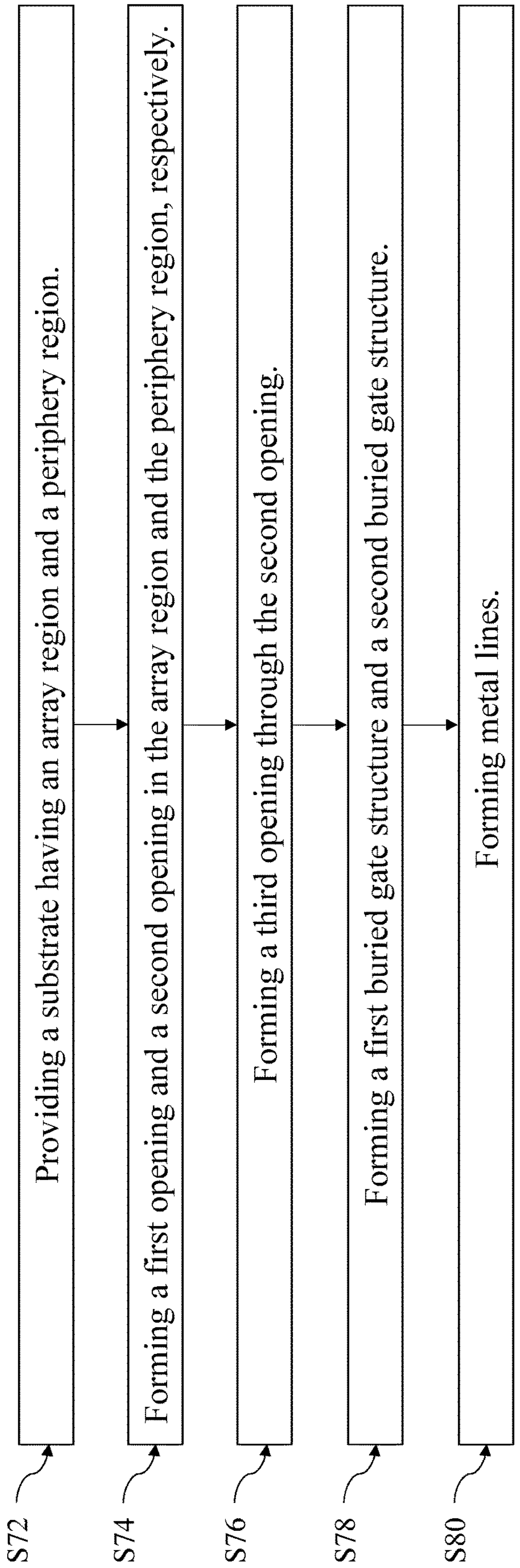
FIG. 7 is a flow chart of a method of manufacturing a semiconductor structure according to some embodiments of the present disclosure.

Reference is made to FIG. 7. FIG. 7 is a flow chart of a method 70 of manufacturing the semiconductor structure 10 according to some embodiments of the present disclosure. The method 70 includes operations S72, S74, S76, S78, and S80. In some embodiments, at least portions of the method 70 may also be applied to manufacture the semiconductor structure 30, the semiconductor structure 40, the semiconductor structure 50, and the semiconductor structure 60.

To facilitate understanding, FIG. 8 to FIG. 18 are provided to show schematic diagrams of intermediate stage of forming the semiconductor structure 10, and the method 70 is described with respect to FIG. 8 to FIG. 18.

Figure 8:
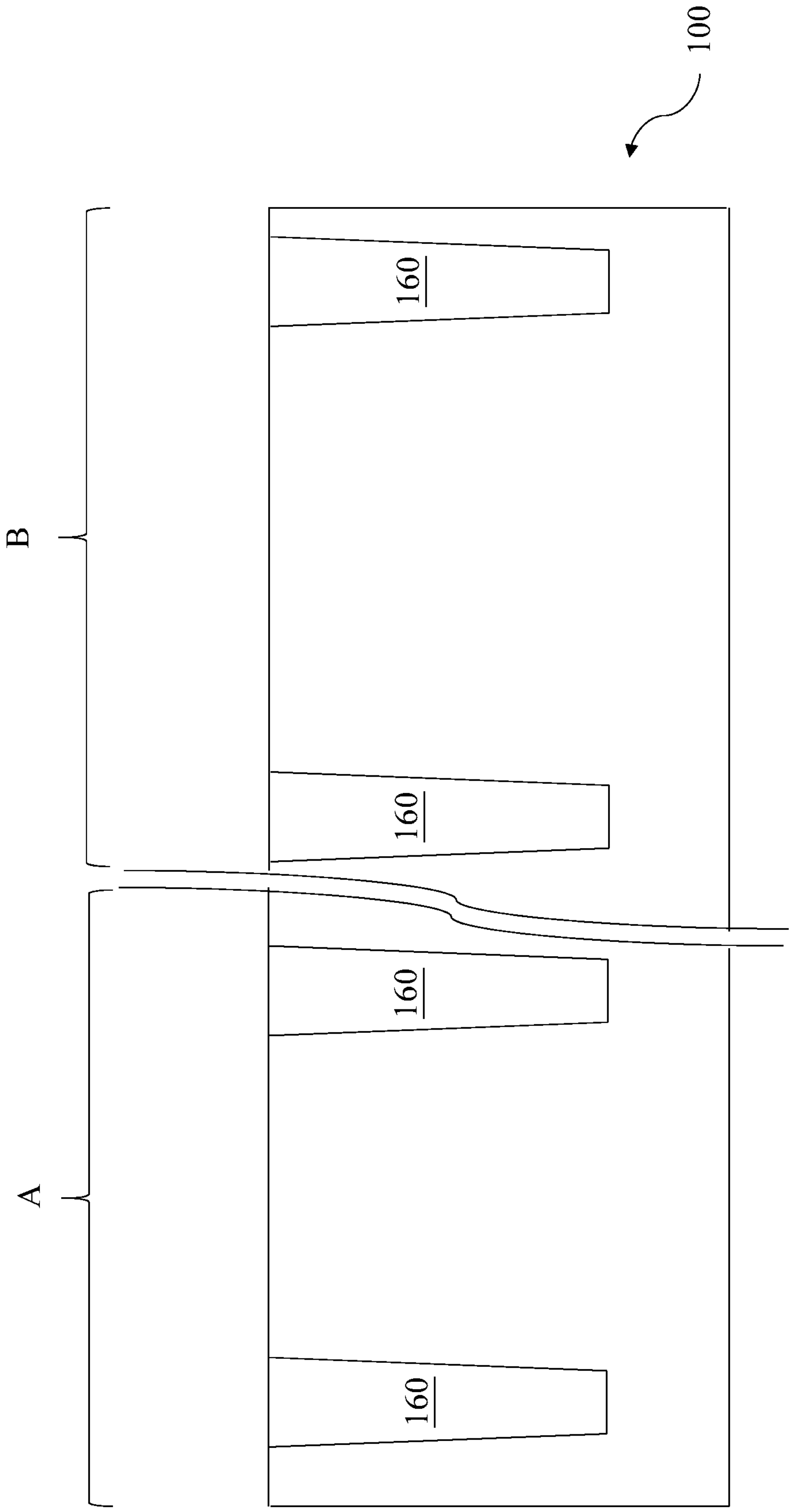
FIG. 8 is a schematic diagram of intermediate stage of forming the semiconductor structure shown in FIG. 1 according to some embodiments of the present disclosure.

In operation S72, the substrate 100 is provided as shown in FIG. 8. The substrate 100 has the array region A and the periphery region B. The isolation structures 160 are disposed in both of the array region A and the periphery region B of the substrate 100.

Figure 9:
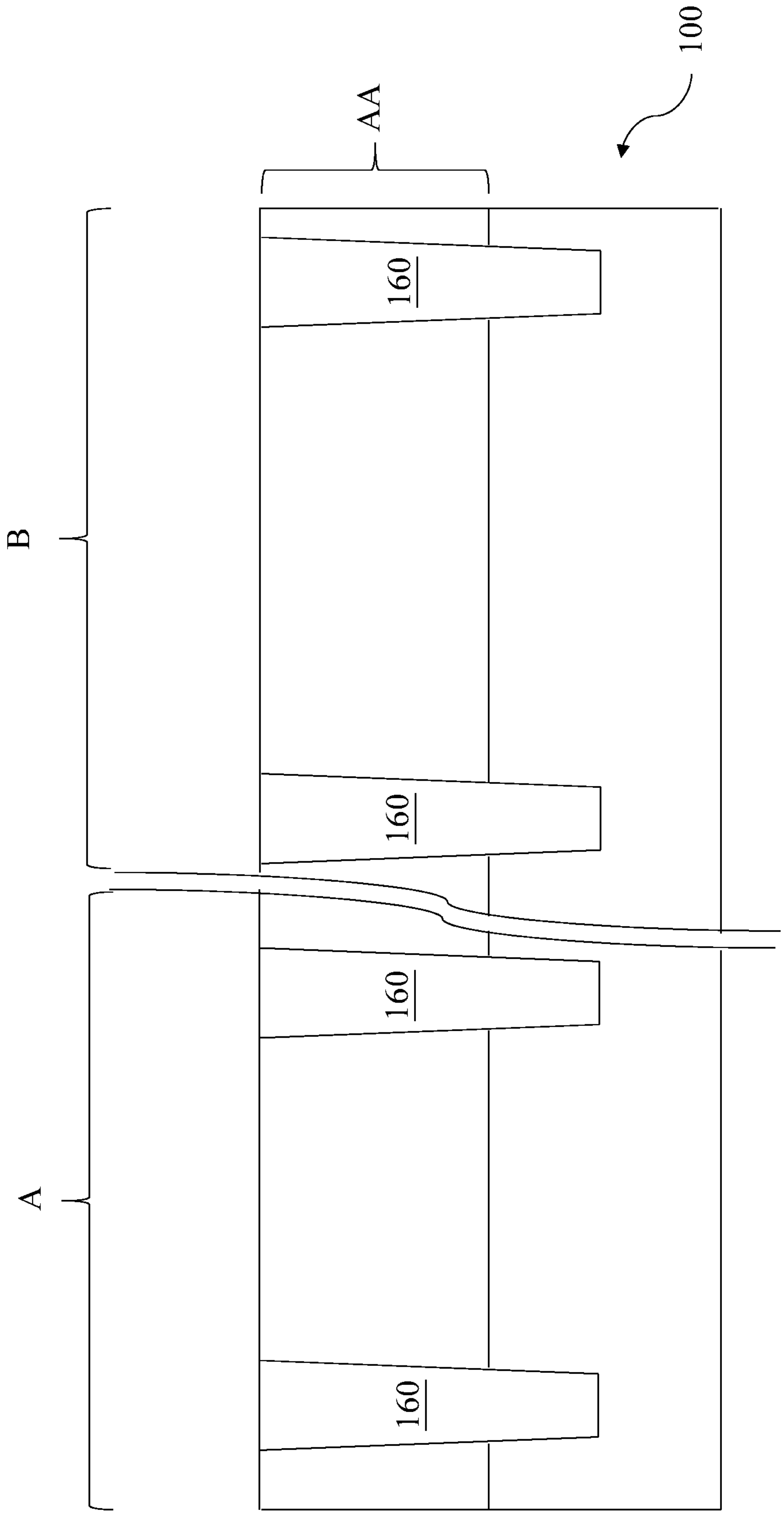
FIG. 9 is a schematic diagram of intermediate stage of forming the semiconductor structure shown in FIG. 1 according to some embodiments of the present disclosure.

In FIG. 9, an ion implantation process is perform to form the active area AA in the substrate 100 according some embodiments of the present disclosure.

Figure 10:
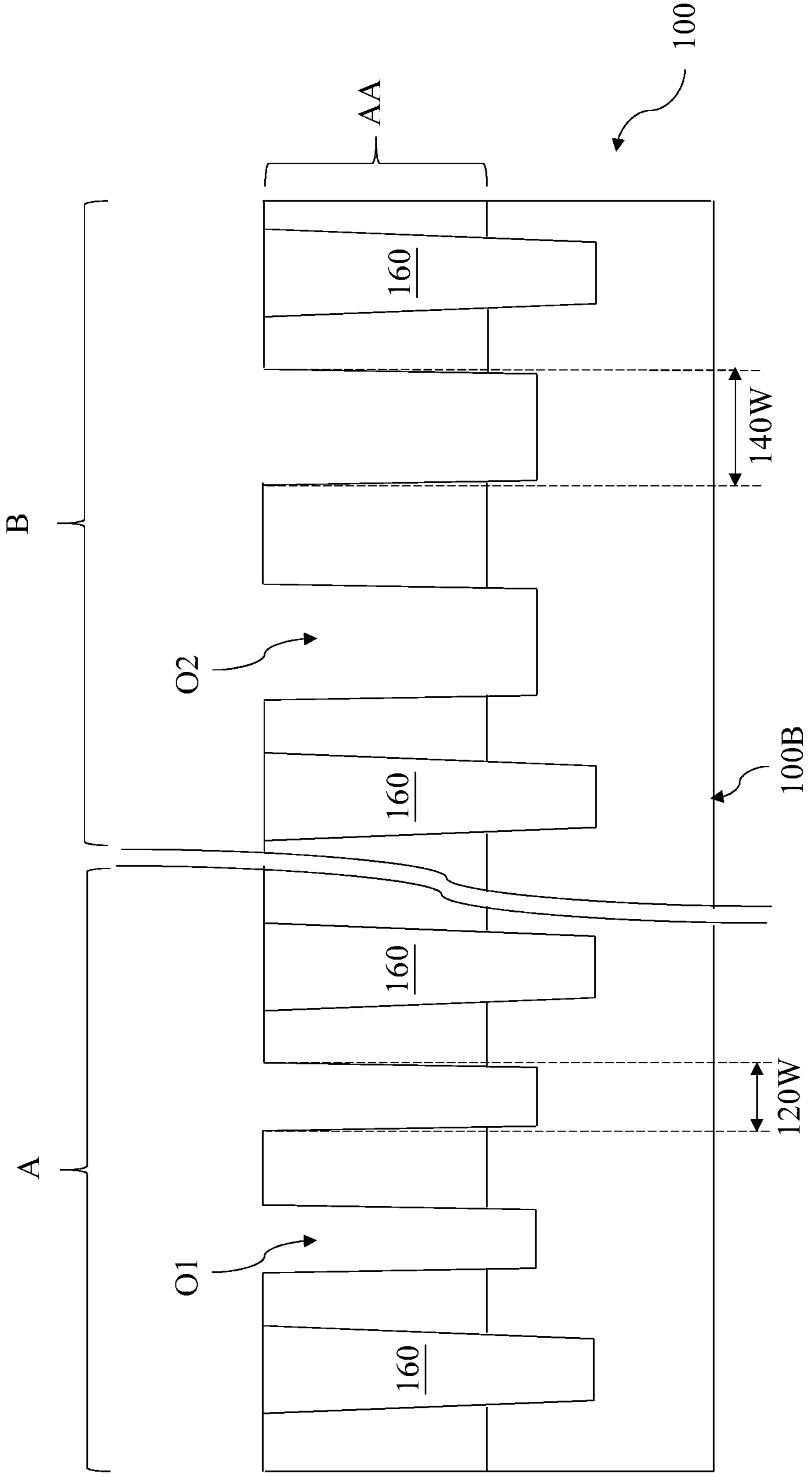
FIG. 10 is a schematic diagram of intermediate stage of forming the semiconductor structure shown in FIG. 1 according to some embodiments of the present disclosure.

In operation S74, openings O1 and opening O2 are forming in the array region A and the periphery region B, respectively, as shown in FIG. 10. The openings O1 are formed for the first buried gate structures 120. The openings O1 and the opening O2 penetrate through the active area AA toward the bottom surface 100B of the substrate 100. The width of the opening O1 is equal to the width 120W of the first buried gate structure 120, and the width of the opening O2 is equal to the width 140W of the second buried gate structure.

Figure 11:
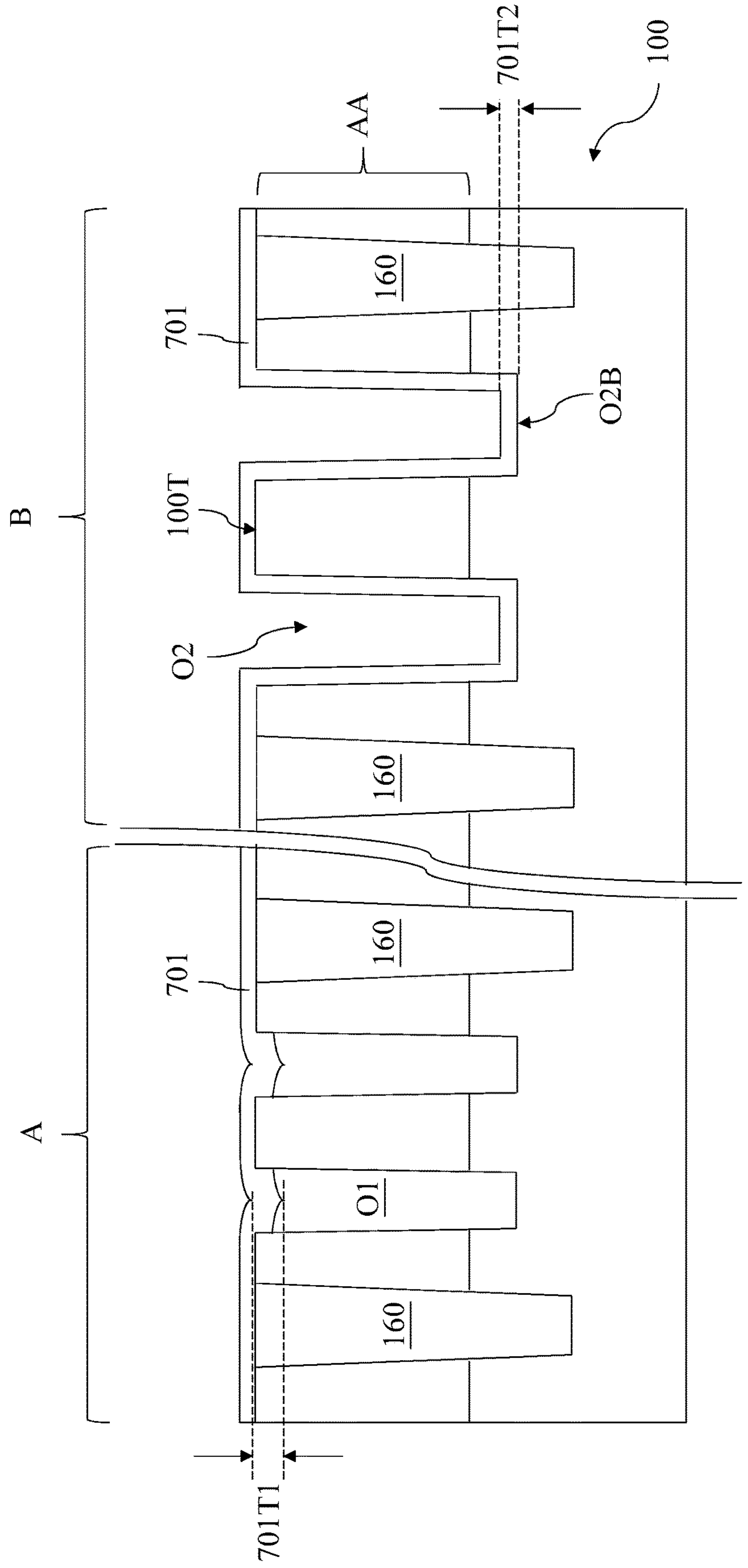
FIG. 11 is a schematic diagram of intermediate stage of forming the semiconductor structure shown in FIG. 1 according to some embodiments of the present disclosure.
Figure 12:
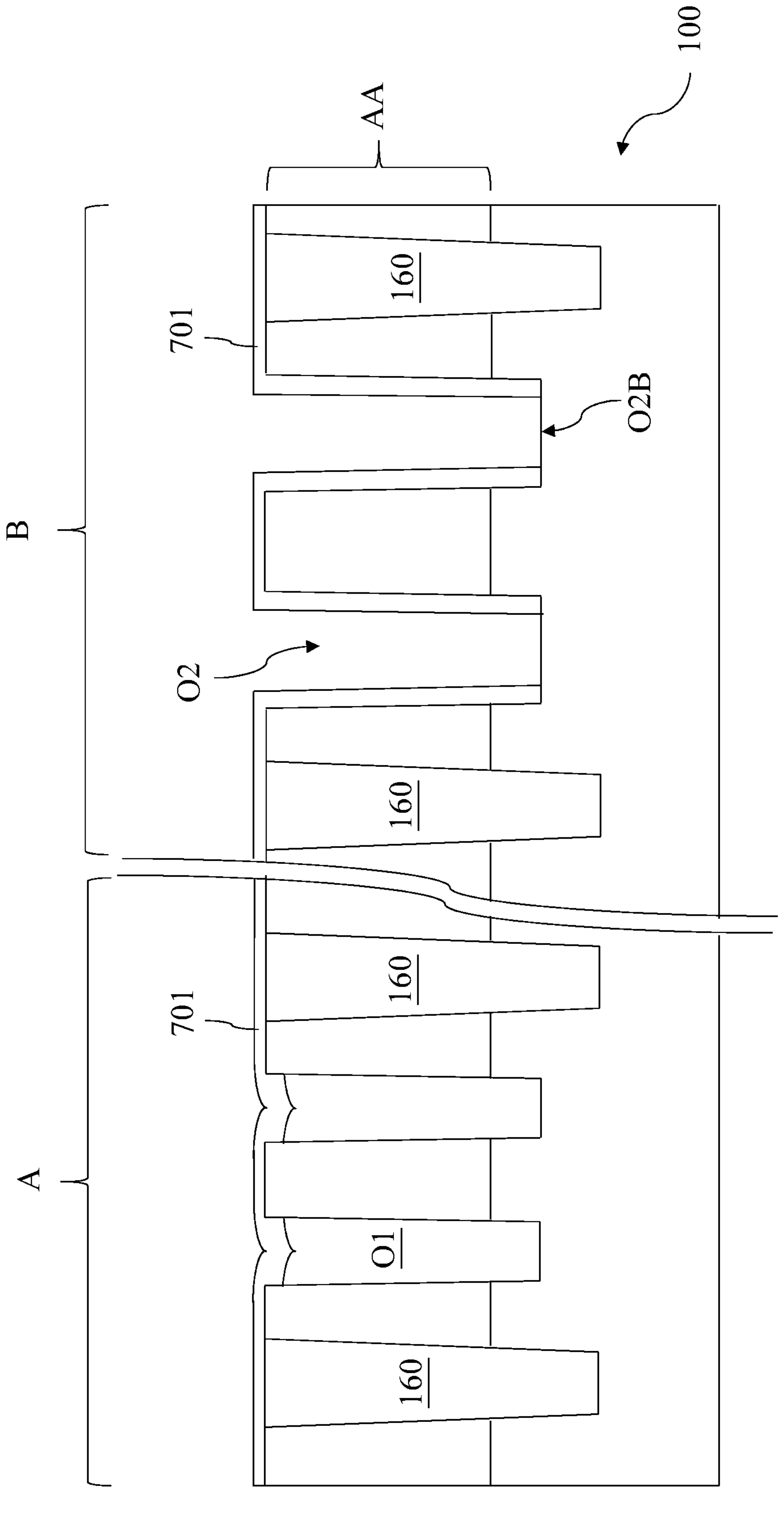
FIG. 12 is a schematic diagram of intermediate stage of forming the semiconductor structure shown in FIG. 1 according to some embodiments of the present disclosure.
Figure 13:
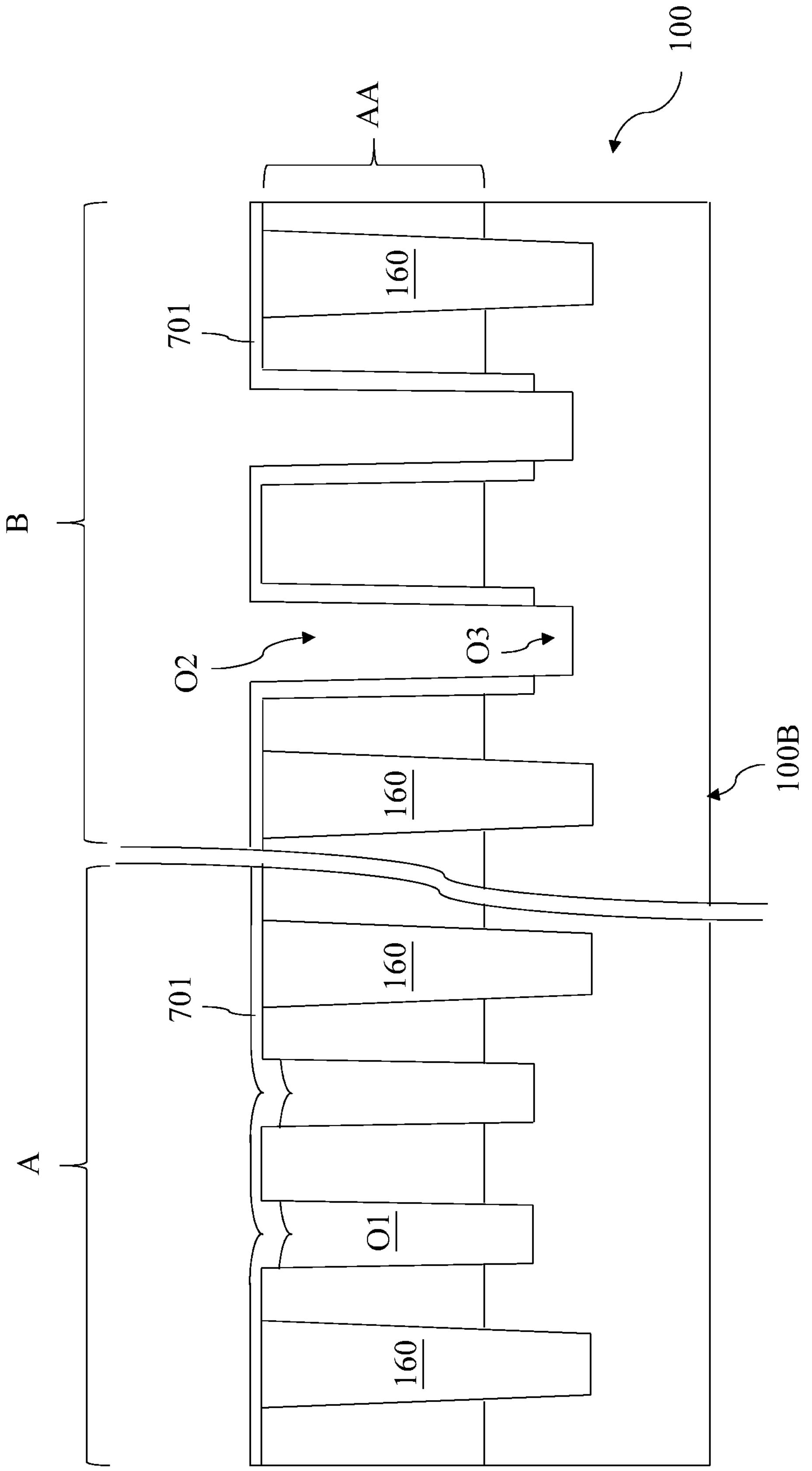
FIG. 13 is a schematic diagram of intermediate stage of forming the semiconductor structure shown in FIG. 1 according to some embodiments of the present disclosure.

In operation S76, opening O3 are formed through the openings O2 as shown in FIG. 11 to FIG. 13.

In FIG. 11, a deposition process is performed to form a mask layer 701. In some embodiments, the deposition process is an atomic layer deposition (ALD) process. The mask layer 701 is formed on the top surface 100T of the substrate 100 and lining on the openings O2. Because the width of the openings O2 is sufficient for forming the mask layer 701 without enclosing the openings O2. However, because the width of the openings O1 is smaller, the mask layer 701 may enclose the openings O1 due to the high aspect ratio. In some embodiments, a thickness 701T1 of the mask layer 701 over the openings O1 is greater than a thickness 701T2 of the mask layer 701 over the bottom surface O2B of the openings O2.

In FIG. 12, an etching process is performed to remove the mask layer 701 which is over the bottom surface O2B of the openings O2. After the etching process, the bottom surface O2B is exposed. In some embodiments, the etching process is a reactive-ion etching (RIE) process. Because the thickness 701T2 is less than the thickness 701T1, when the bottom surface O2B is exposed, the openings O1 are still enclosed by the mask layer 701.

In FIG. 13, another etching process is performed to form the openings O3 using the remained mask layer 701 as a mask. The bottom surface O2B is etched toward the bottom surface 100B of the substrate 100 so as to deepen the openings O2, and the extra spaces made by the etching process are the openings O3.

After the openings O3 are formed, the mask layer 701 is removed.

In operation S78, the first buried gate structures 120 and the second buried gate structures 140 are formed as shown in FIG. 14 to FIG. 18.

Figure 14:
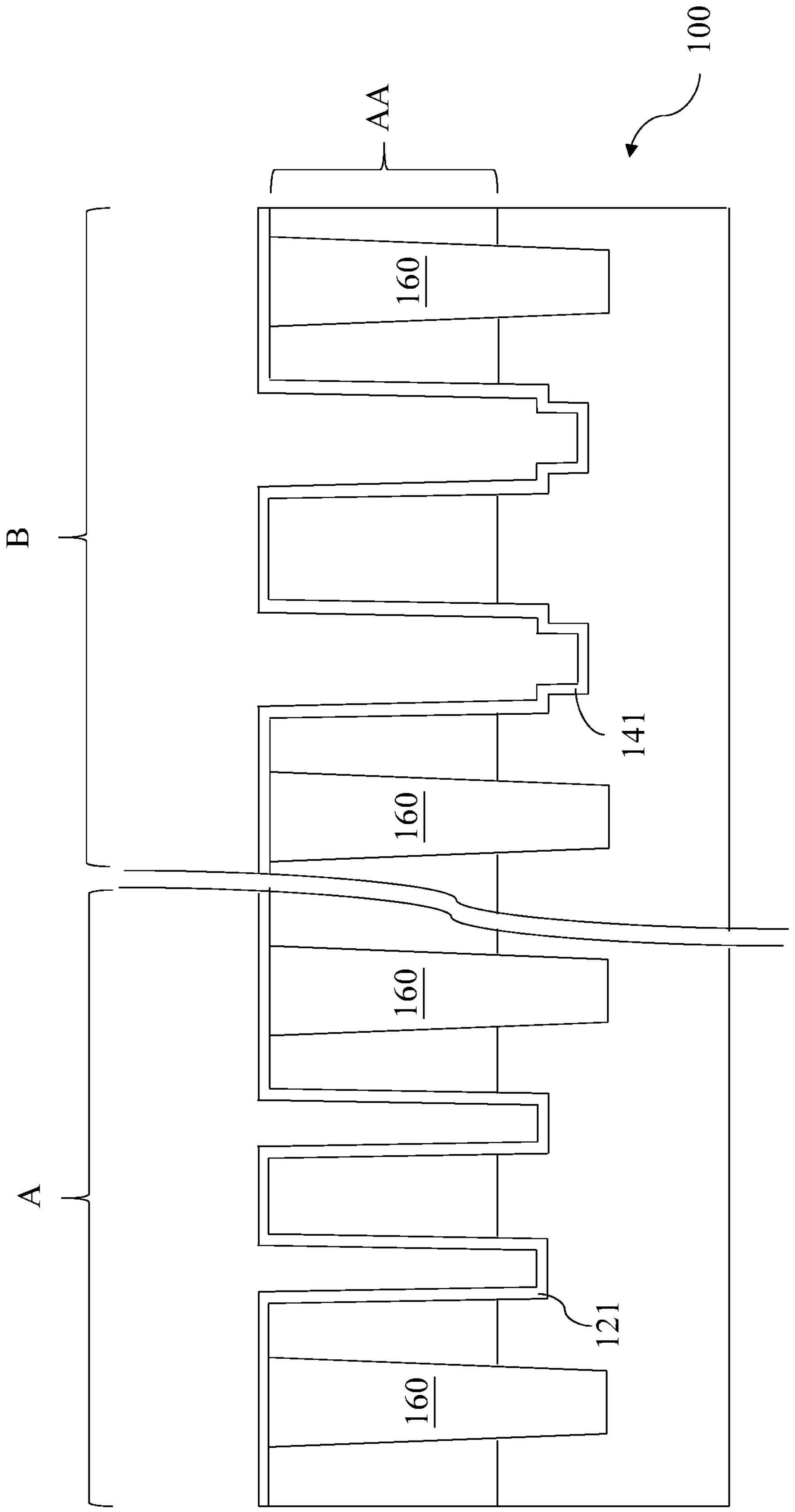
FIG. 14 is a schematic diagram of intermediate stage of forming the semiconductor structure shown in FIG. 1 according to some embodiments of the present disclosure.

In FIG. 14, the gate dielectric layer 121 is formed over the substrate 100 and lining the openings O1, and the gate dielectric layer 141 is formed over the substrate 100 and lining the opening O2 and the opening O3. In some embodiments, the gate dielectric layer 121 and the gate dielectric layer 141 are concurrently formed by the same process.

Figure 15:
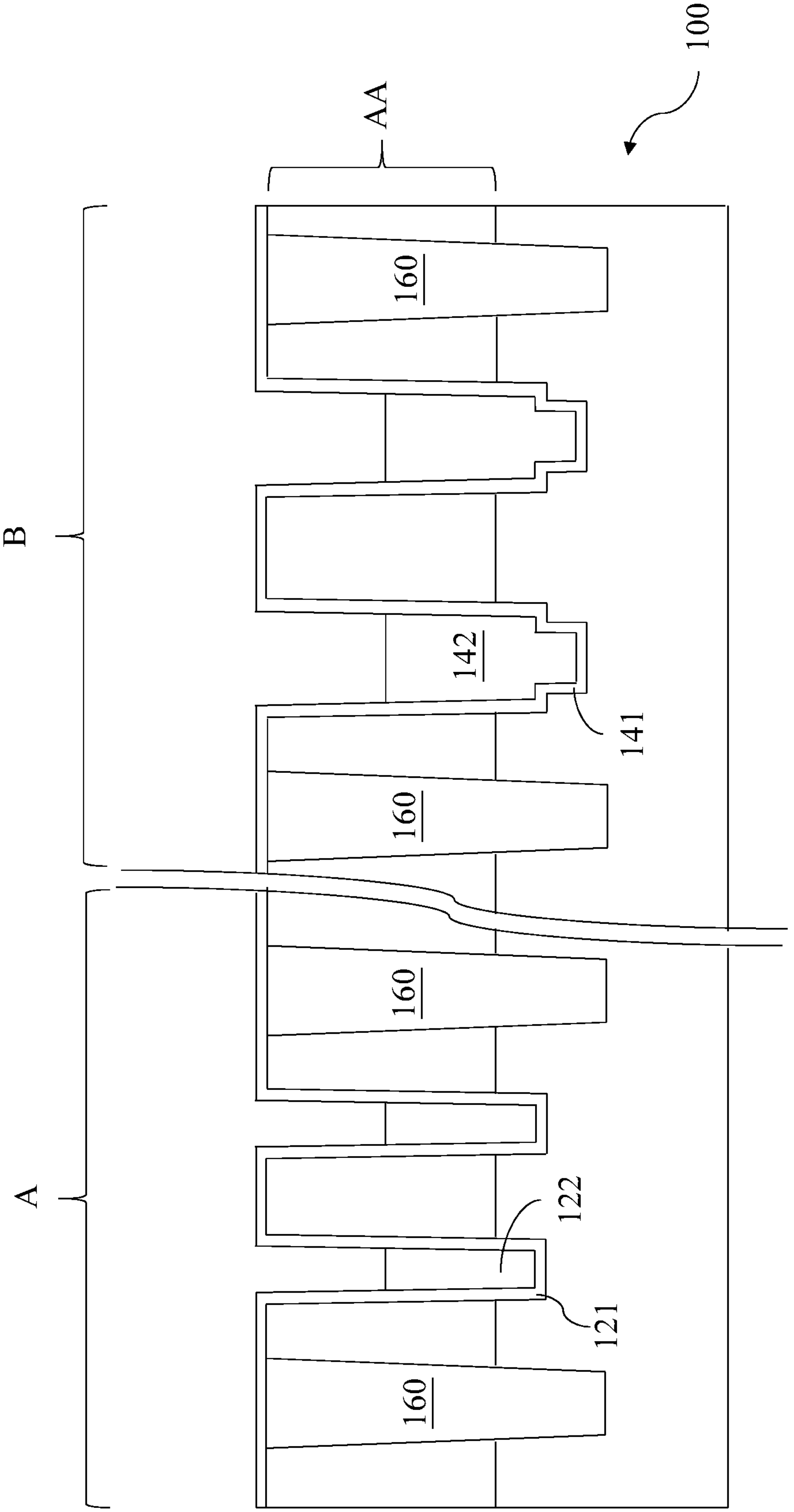
FIG. 15 is a schematic diagram of intermediate stage of forming the semiconductor structure shown in FIG. 1 according to some embodiments of the present disclosure.

In FIG. 15, the gate electrode 122 and the gate electrode 142 are formed. The gate electrode 122 is partially filled in the openings O1. The gate electrode 142 is fully filled in the openings O3 and partially filled in the openings O2.

Figure 16:
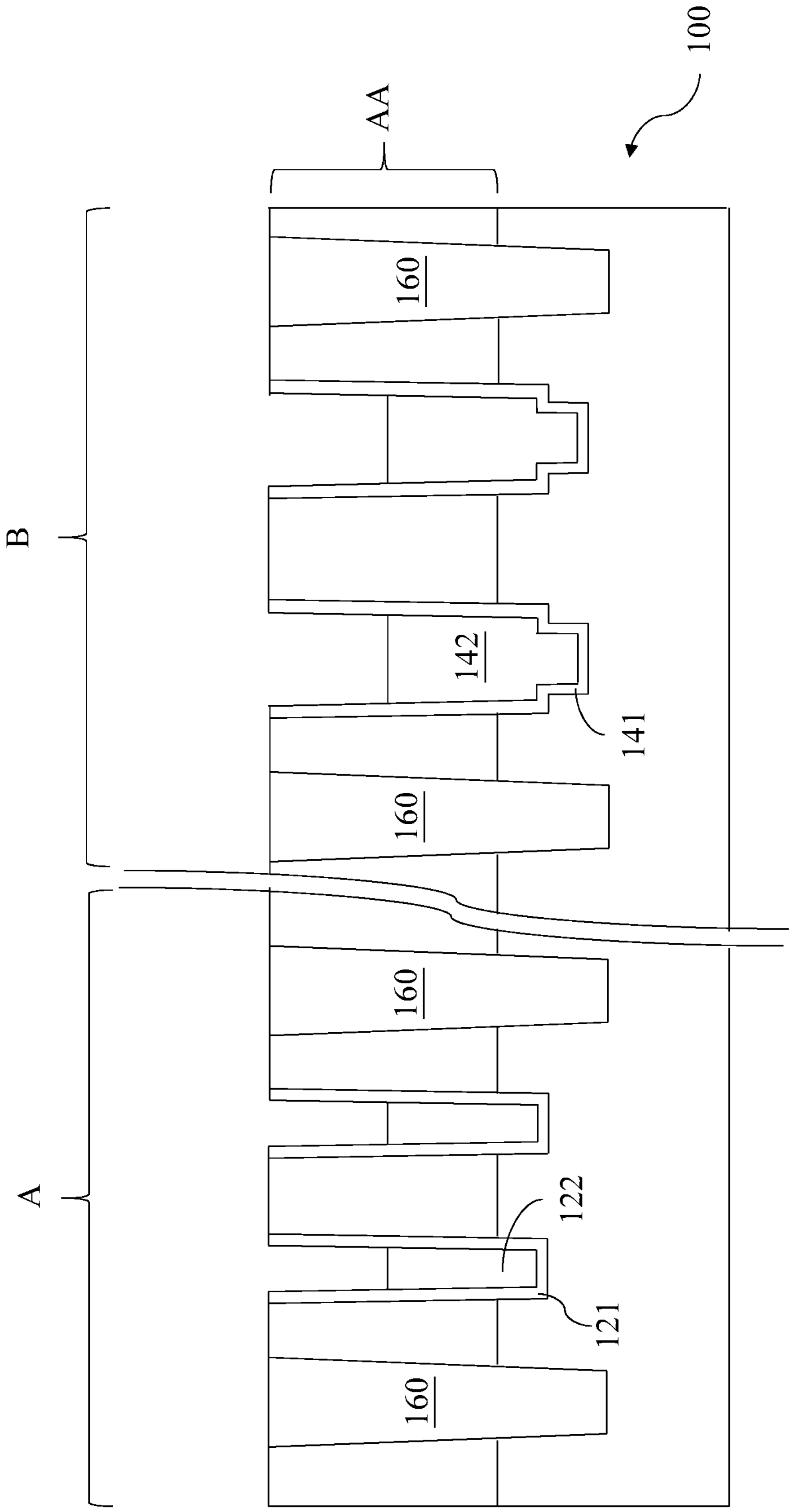
FIG. 16 is a schematic diagram of intermediate stage of forming the semiconductor structure shown in FIG. 1 according to some embodiments of the present disclosure.

In FIG. 16, after the gate electrode 122 and the gate electrode 142 are formed, the gate dielectric layer 121 and the gate dielectric layer 141 over the top surface 100T of the substrate 100 are removed.

Figure 17:
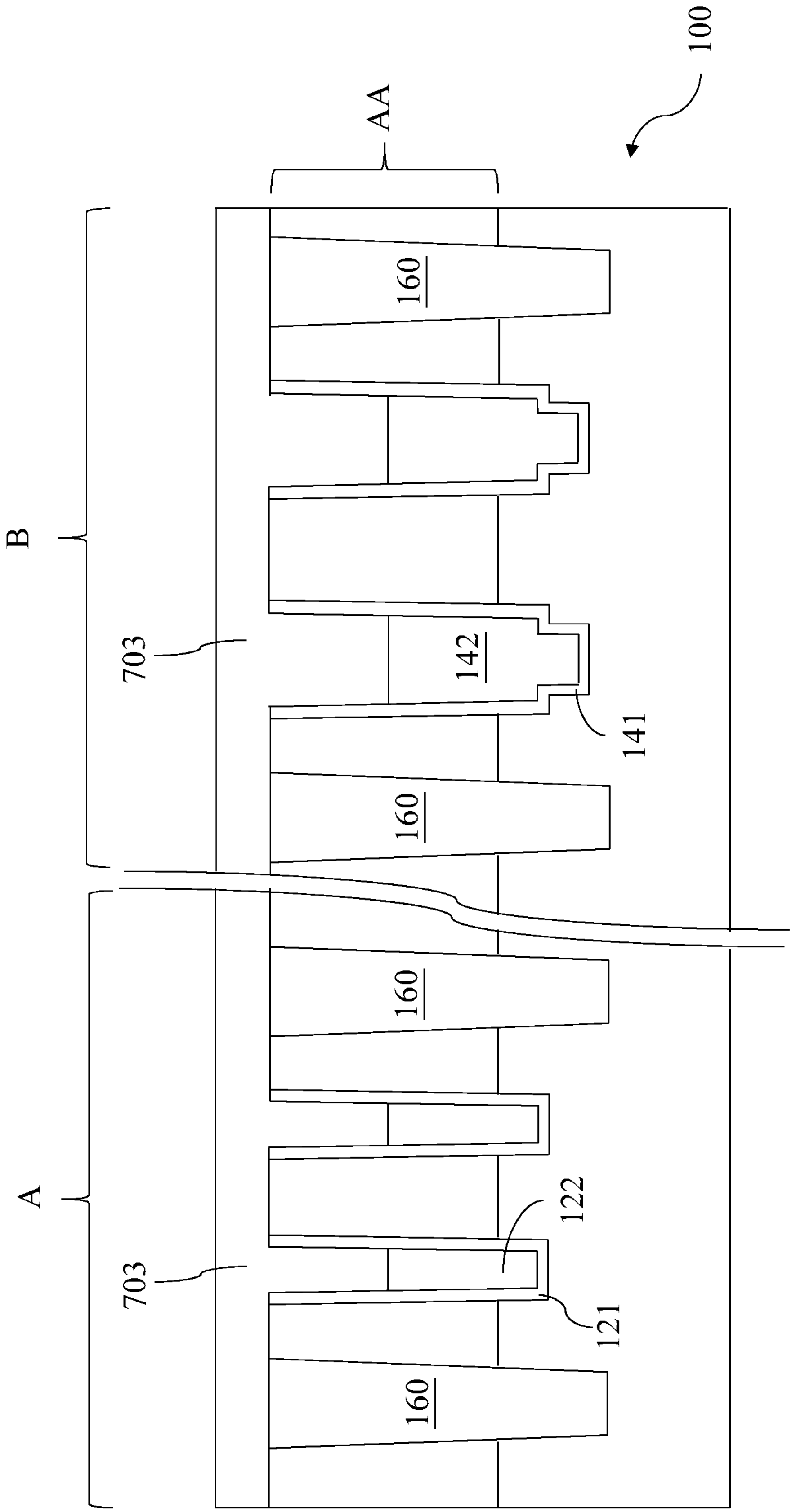
FIG. 17 is a schematic diagram of intermediate stage of forming the semiconductor structure shown in FIG. 1 according to some embodiments of the present disclosure.

In FIG. 17, a dielectric layer 703 is formed over the substrate 100, the gate dielectric layer 121, the gate electrode 122, the gate dielectric layer 141, the gate electrode 142, and the isolation structures 160. The dielectric layer 703 is filled into the remained space of the openings O1 and the openings O2, and in contact with the gate electrode 122 and the gate electrode 142.

Figure 18:
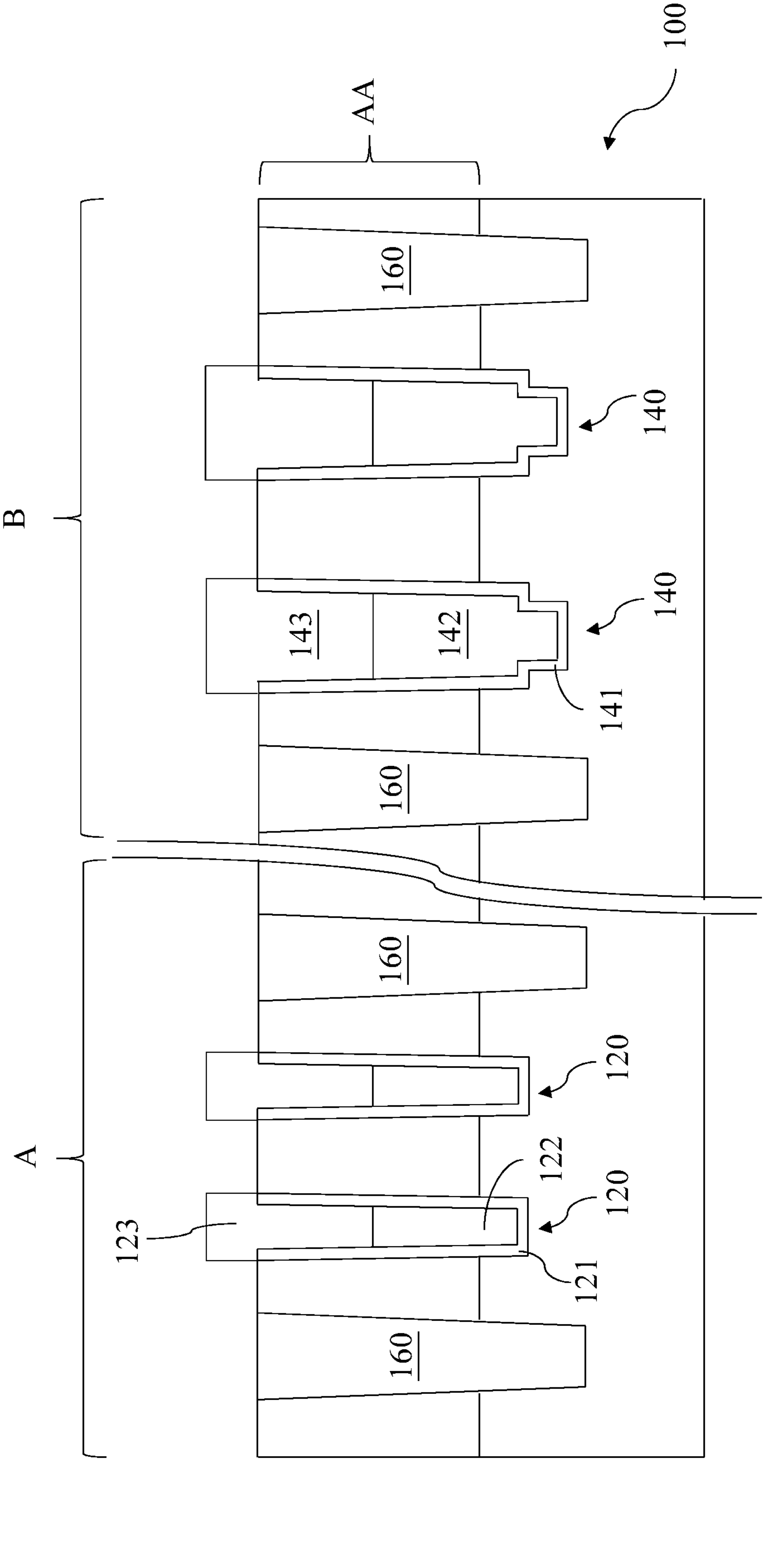
FIG. 18 is a schematic diagram of intermediate stage of forming the semiconductor structure shown in FIG. 1 according to some embodiments of the present disclosure.

In FIG. 18, the capping layer 123 and the capping layer 143 are formed. In some embodiments, a photolithography process may be performed to define the capping layer 123 and the capping layer 143, and an etching process is then performed to remove a portion of the dielectric layer 703 to form the capping layer 123 and the capping layer 143 according to the defined result of the photolithography process.

After the capping layer 123 and the capping layer 143 are formed, the first buried gate structures 120 and the second buried gate structures 140 are formed.

In operation S80, the metal lines 180 are formed as shown in FIG. 1. The metal lines 180 are formed over the substrate 100, the isolation structures 160, the capping layer 123, and the capping layer 143.

In one embodiment of the present disclosure, a semiconductor structure is provided. The semiconductor structure includes a substrate, a first buried gate structure, and a second buried gate structure. The substrate has an array region and a periphery region. The first buried gate structure is extended from a first surface of the substrate along a first direction into the substrate and disposed in the array region. The second buried gate structure is extended from the first surface of the substrate along the first direction into the substrate and disposed in the periphery region. A depth of the first buried gate structure is less than a depth of the second buried gate structure along the first direction.

In another embodiment of the present disclosure, a method of manufacturing a semiconductor structure is provided. The method includes: providing a substrate having an array region and a periphery region; forming a first opening and a second opening in the array region and the periphery region, respectively; forming a third opening through the second opening; and forming a first buried gate structure and a second buried gate structure. The first buried gate structure is formed in the first opening, and the second buried gate structure is formed in the second opening and the third opening.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A semiconductor structure, comprising:
- a substrate, having an array region and a periphery region;
- a first buried gate structure, extended from a first surface of the substrate along a first direction into the substrate and disposed in the array region; and
- a second buried gate structure, extended from the first surface of the substrate along the first direction into the substrate and disposed in the periphery region,
- wherein a depth of the first buried gate structure is less than a depth of the second buried gate structure along the first direction;
- wherein the substrate comprises an active area, wherein the active area is coplanar with the first surface of the substrate,
- wherein a depth of the active area is less than the depth of the first buried gate structure;
- wherein the active area comprises:
- a first doped region and a second doped region, disposed in the array region; and
- a third doped region and a fourth doped region, disposed in the periphery region,
- wherein the first buried gate structure is disposed between the first doped region and the second doped region, and the second buried gate structure is disposed between the third doped region and the fourth doped region;
- wherein the first buried gate structure has a first protruding portion protruding from the active area toward a second surface of the substrate, and the second buried gate structure has a second protruding portion protruding from the active area toward the second surface of the substrate, wherein the second surface is opposite to the first surface;
- wherein the second protruding portion comprises:
- a lower part; and
- an upper part, over the lower part,
- wherein the lower part is narrower than the upper part.

2. The semiconductor structure of claim 1, further comprising:
- a first isolation structure and a second isolation structure, disposed in the array region of the substrate; and
- a third isolation structure and a fourth isolation structure, disposed in the periphery region of the substrate,
- wherein the first buried gate structure is disposed between the first isolation structure and the second isolation structure, and the second buried gate structure is disposed between the third isolation structure and the fourth isolation structure.

3. The semiconductor structure of claim 1, wherein the substrate further comprises a first channel region and a second channel region, wherein the first protruding portion of the first buried gate structure is surrounded by the first channel region, and the second protruding portion of the second buried gate structure is surrounded by the second channel region.

4. The semiconductor structure of claim 1, wherein a first side length of the first protruding portion is less than a second side length of the second protruding portion.

5. The semiconductor structure of claim 1, wherein the second protruding portion has a stair-step sidewall.

6. The semiconductor structure of claim 1, further comprising:
- a first metal line, disposed over the substrate and in contact with the first doped region; and
- a second metal line, disposed over the substrate and in contact with the third doped region.

7. The semiconductor structure of claim 1, wherein a width of the first buried gate structure is less than a width of the second buried gate structure along a second direction perpendicular to the first direction.

8. The semiconductor structure of claim 1, wherein the first buried gate structure comprises a first gate dielectric layer and a first gate electrode, and the second buried gate structure comprises a second gate dielectric layer and a second gate electrode,
- wherein the first gate electrode is separated from the substrate by the first gate dielectric layer, and the second gate electrode is separated from the substrate by the second gate dielectric layer.

9. The semiconductor structure of claim 8, wherein the first buried gate structure further comprises a first capping layer, and the second buried gate structure further comprises a second capping layer,
- wherein the first capping layer is disposed over the first gate electrode and separated from the substrate by the first gate dielectric layer, and the second capping layer is disposed over the second gate electrode and separated from the substrate by the second gate dielectric layer.

* * * * *